United States Patent
Kasapi

(10) Patent No.: US 6,961,672 B2
(45) Date of Patent: Nov. 1, 2005

(54) UNIVERSAL DIAGNOSTIC PLATFORM FOR SPECIMEN ANALYSIS

(75) Inventor: Steven Kasapi, San Francisco, CA (US)

(73) Assignee: Credence Systems Coporation, Milpitas, CA (US)

( * ) Notice: Subject to any disclaimer, the term of this patent is extended or adjusted under 35 U.S.C. 154(b) by 70 days.

(21) Appl. No.: 10/379,950

(22) Filed: Mar. 5, 2003

(65) Prior Publication Data

US 2003/0220760 A1 Nov. 27, 2003

Related U.S. Application Data

(60) Provisional application No. 60/361,406, filed on Mar. 5, 2002.

(51) Int. Cl.[7] .................................................. G06F 11/30
(52) U.S. Cl. .......................... 702/182; 324/97; 700/108
(58) Field of Search .......................... 702/183; 714/724, 714/733; 324/158.1; 125/35; 118/35, 50

(56) References Cited

U.S. PATENT DOCUMENTS

| | | | | |
|---|---|---|---|---|
| 3,809,050 A | * | 5/1974 | Chough et al. | 125/35 |
| 5,911,039 A | * | 6/1999 | Hashizume et al. | 714/30 |
| 6,448,802 B1 | * | 9/2002 | Hirt | 324/765 |
| 6,452,378 B1 | * | 9/2002 | Toriyama et al. | 324/97 |
| 6,536,006 B1 | * | 3/2003 | Sugamori | 714/724 |
| 6,681,142 B2 | * | 1/2004 | Schinkowitsch | 700/108 |

* cited by examiner

Primary Examiner—Kamini Shah
(74) Attorney, Agent, or Firm—Joseph Bach; JB Patents.com

(57) ABSTRACT

A universal diagnostic platform (UDP) is described which incorporates several measurement modules for testing a device under test (DUT). Users can switch between measurement modules without removing the DUT. The UDP employs a common fixturing and software system for all the modules.

20 Claims, 6 Drawing Sheets

UNIVERSAL DIAGNOSTIC PLATFORM FOR SPECIMEN ANALYSIS

CROSS REFERENCE TO RELATED APPLICATIONS

This application is a continuation of, and claims priority from, Provisional Patent Application Ser. No. 60/361,406, filed Mar. 5, 2002.

BACKGROUND OF THE INVENTION

1. Field of the Invention

The invention relates to systems for testing and diagnostics of semiconductor wafers and integrated circuits.

2. Discussion of Related Art

It is well known in the art to use various analysis tools to test and debug integrated circuits (IC) during the design, development, and manufacturing phases. Various tools are used to check the operating speed of the devices on the IC, to characterize its response to various inputs, and to investigate areas susceptible to failure. Many of these devices use light, either reflected or omitted from the IC to perform the analysis.

Since various testing equipment have various requirements, it is conventional in the prior art to build each testing apparatus as a separate tool/platform. This increases the cost of each tool, requires more floor space to house all the needed tools, and slows the testing, as the IC needs to be moved from tool to tool. Additionally, each tool requires different adapter in order to place the IC on its specially designed IC holder.

Examples of such prior art stand-alone system include diagnostic systems for performing laser probing of changing electric fields and free carrier distributions inside integrated circuits; emission systems for performing static emission analysis; systems for performing thermal mapping of IC's; systems for performing picosecond imaging circuit analysis (PICA); systems for performing measurements of resistive shorts using laser scanning techniques. However, users often need to perform a number of analyses on a particular packaged part or wafer, so they need to have all of the stand-alone tools at their disposal and need to move the IC from tool to tool to perform these various tests.

For example, a user might look at a device using static emission to find sites on the device which are drawing excessive power. Once the sites are located the user might wish to use a separate time-resolved photon emission tool to probe dynamic activity in a net near the location of the excessive emission. However, Fixturing the IC in each of the diagnostic machines typically takes an hour or more. Moreover, in each individual tool electrical connections, cooling apparatus for the device under test, etc. are provided independently, thereby increasing the cost of each tool. Furthermore, once the IC has been mounted on the second tool, the area of interest on the IC needs to be identified and located again. Thus, performing more than one type of testing on an IC is a cumbersome operation.

A user may also switch among several tools as he performs a variety of measurements while trying to discover the root cause of the problem. However, settling time for the device, if it requires cooling before moving it to the next tool, can take several hours. In most cases the tester is required during device setup. Tester time is expensive and often difficult to obtain.

Therefore, there is a need in the industry for a simplified process for enabling more than one type of testing on an IC without transferring the IC among various testers.

SUMMARY

The present invention solves the above noted disadvantages of stand-alone tools by providing a universal platform for performing variety of measurements without requiring removal and transfer of the device under test.

In one aspect of the invention, a universal diagnostic platform (UDP) is provided for performing a variety of device analysis and measurements. The UDP is intended to be extendible, flexible, and upgradeable. The user mounts the device once in the platform and leaves the device, electrical stimulus, cooling, and other components of the fixturing in place. The platform incorporates provisions for moving collection optics to a desired location on the IC to be measured. The UDP support a number of modules, e.g., one, two, or three modules for different analysis and measurements.

According to another aspect of the invention, various modules can be added and removed with or without the DUT in place. The user can switch between installed modules using a software interface.

According to yet another aspect of the invention, the software interface is common to the platforms and may incorporate control and monitoring of the UDP, optical image navigation, CAD navigation linked to image, simulation extraction and comparison, data analysis.

According to a further aspect of the invention, a UDP is provided, which includes a vibration-isolated platform having IC mounting fixture provided thereupon. A multiple-modules loading plate is provided in registration/alignment with the platform for mounting thereupon testing modules. A collection optics arrangement is mounted on a movable stage. A plurality of movable mirrors is provided in registration/alignment with the collection optics arrangement. The movable mirrors are arranged so as to selectively provide optical path to at least one of the testing modules. A controller provides motion signals to control the movement of the movable stage and the movable mirrors.

DETAILED DESCRIPTION

Figure 1:
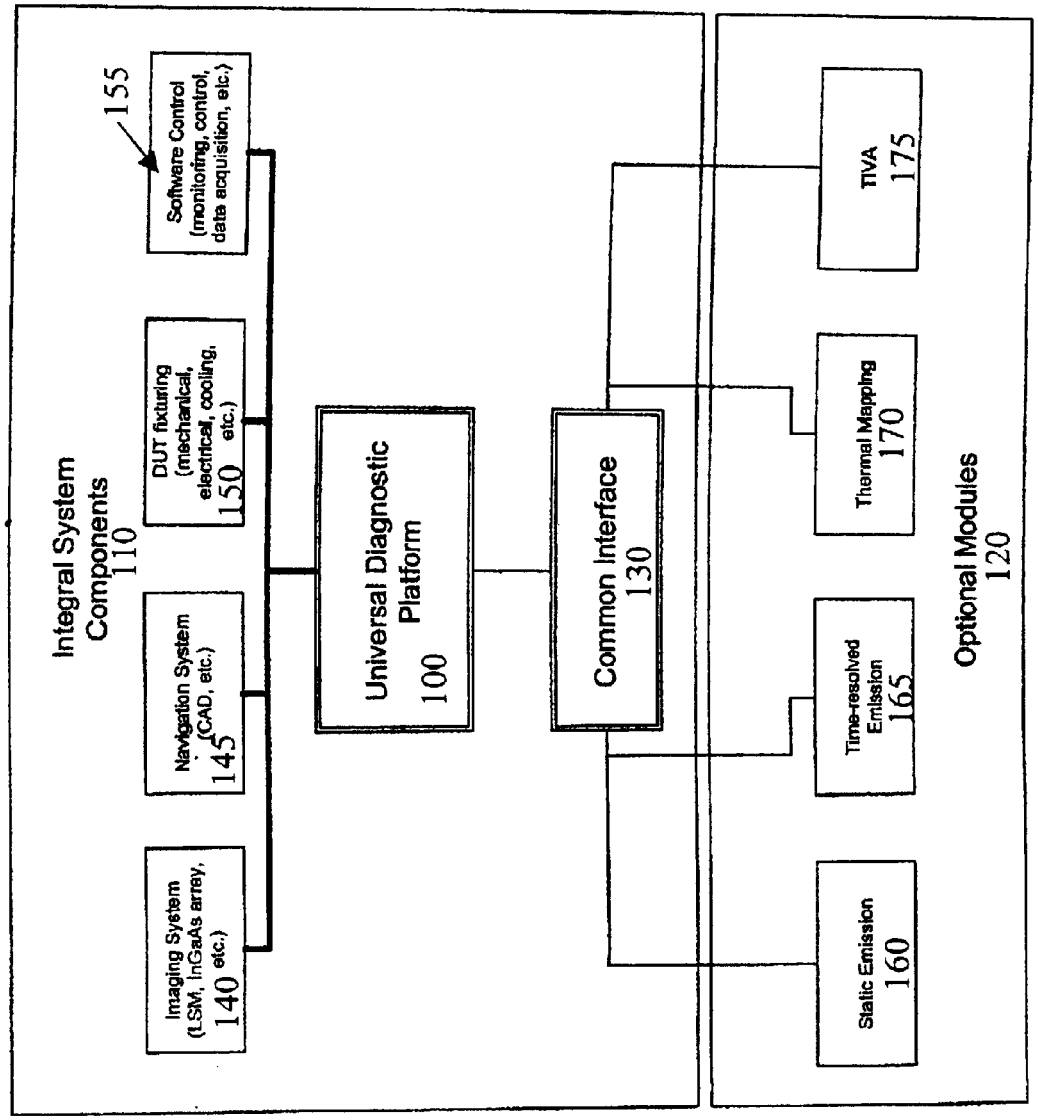
FIG. 1 is a block diagram depicting the general architecture of an embodiment of the invention.

FIG. 1 is a block diagram showing a high level layout of an embodiment of the inventive platform. The platform comprises integral system components, generally 110, and removable modules, generally 120. The integral system components 110 are fixed to the universal platform 100, while the removable modules 120 are interchangeable and may be any testing module having provisions for mounting onto the platform 100. The mounting is accomplished via a common interface 130, which may be hardware only, or hardware and software interface.

The integral system components 110 may include an imaging system 140 (or just collection optics for imaging), a navigation system 145, a specimen mounting 150 (such as DUT fixturing), and system control 155. The various interchangeable modules may be any of various testing systems conventionally available only as stand-alone tools. These may be static emission module 160, time-resolved emission module 165, thermal mapping module 170, resistive shorts measurement (TIVA) module 175, etc.

Figure 2:
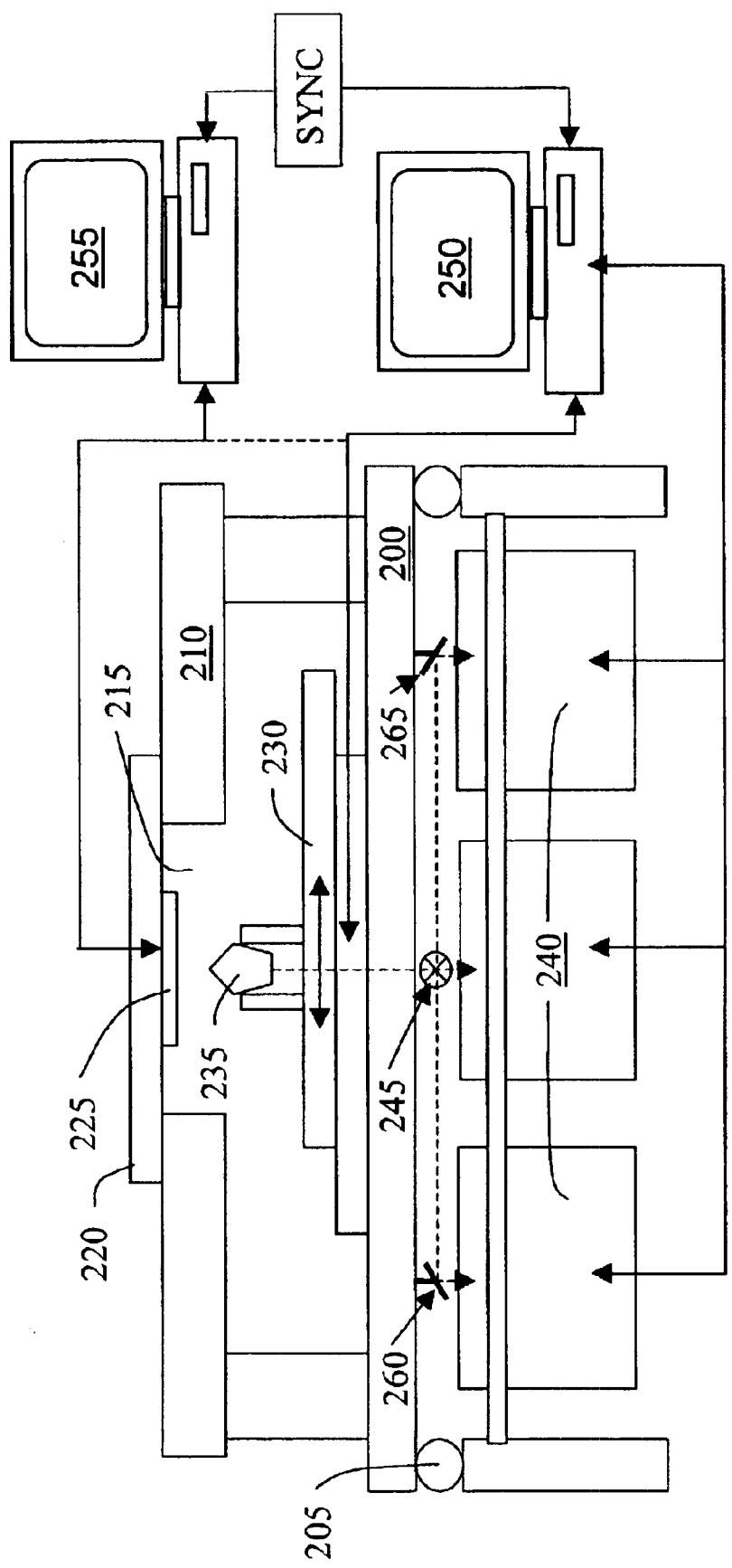
FIG. 2 is a general schematic showing a side view of an embodiment of the invention.

FIG. 2 depicts a side view of an embodiment of the inventive platform. The platform generally comprises a vibration isolation bench 200, isolated from ground vibration by isolators 205. Affixed on top of the bench 200 is a fixture table 210 having opening 215. A specimen mounting board 220 is secured to the fixture table 210, and a specimen to be inspected 225, e.g., an integrated circuit or a semiconductor wafer, is mounted to the mounting board 220 and is situated in the opening 215.

A movable stage 230, e.g., an x-y-z stage, is provided on top of the bench 200, and collection optics 235 is mounted onto the movable stage 230. Thus, using the movable stage, one can aim the collection optics at any particular region of the specimen 225. The underside of bench 200 includes a plurality of mounting bays 240, so that various modules can be attached to the bench 200. A switchable mirror 245 can be controlled to establish an optical path with mirror 260, so as to engage the left module 240; establish an optical path with mirror 265, so as to engage the right module 240; or withdrawn from the light path, so as to engage the center module 240.

The modules that may be mounted in the module bays 240 may be any of the testing modules, such as those noted above. Additionally, if the inspected object is a semiconductor wafer, the modules may be inspection and/or metrology modules, such as Atomic Force Microscope (AFM), Optical CD (OCD), particles monitor, and the like, conventionally available as stand-alone tools. Any of these individual diagnostic modules can be added or removed while the inspected object 225 is left mounted onto mounting board 220.

The individual modules may or may not require some alignment with the rest of the system, depending on the mechanical tolerances that can be achieved. For example, 110 μm blind mechanical repeatability without any alignment may be sufficient. If more accuracy is required, then a manual or automatic alignment procedure will be required. Such techniques are known to those skilled in the art and may include optical pattern matching or using a mechanical sensor to detect the misalignment. The bench 200 will support N modules at any one time; wherein N depends on the final size of the modules and may, for example, be 1, 2, 3, or more.

The specific modules 240 will depend on the workflow specified by the user. The user will be able to select between the installed modules using a software interface, which will reside on a computer 250, such as a general purpose computer pre-programmed to perform the specific task required. The computer 250 communicates with the platform hardware and with modules 240 using an electrical communication method. For some modules, minor switching to that module may require manual intervention. For example, a static emission module with a macro mode (greater than 1:3 imaging) may require manual insertion of a lens element in the collection optics 235. Alternatively, collection optics 235 may include provisions, such as a turret, for handling multiple objectives and/or additional lenses.

Computer 250 may optionally be provided with communication link to the specimen 225 to be inspected, especially if the object is an active device, such as an IC chip. This is depicted by the broken line connection from the computer 250 to specimen 225. In such a case, computer 250 may communicate with the specimen 225, for example providing test signals to stimulate the specimen 225. On the other hand, a conventional Automated Testing Equipment (ATE) 255 may be used to provide the test signals and communicate with the specimen 225. In such a case, a synchronization signal may be provided from the ATE 255 to the computer 250.

As can be understood from the above two embodiments, one set of collection optics is provided and is shared by the various modules. Optionally, an imaging system may also be incorporated into the system and shared by the various modules. Of course, each module may incorporate its own optimized imaging system, used either in conjunction with or separate from the imaging system residing in the platform. For example, the TIVA module may incorporate laser-scanning imaging. The imaging system is used to locate the region of the DUT to be probed. The imaging system may be used in conjunction with CAD or other layout-assisted navigation to locate the region of the DUT to be measured. However, advantageously, a central collection optics 235 is provided for establishing optical path to any of the modules. Consequently, once an area of interest is found using one module, the area can be immediately tested with a second module by simply flipping the switchable mirror 245 so as to establish an optical path to another module. In this manner, there's no need to move the specimen 225 and re-acquire the location of interest. That is, the collection optics 235 can remain aimed of the same area of interest and the switchable mirror is simply flipped in order to engage various testers to probe the same area of interest.

The relevant modules are activated to perform the associated measurement. Imaging and measurement may be performed any number of times in order to identify the source of the failure or problem, or make the appropriate measurement. A means for analyzing, storing, and retrieving the data associated with each of the measurements may be included in the software interface. The common hardware residing in the platform may be shared by the installed modules. Such common hardware may include an imaging system (as already mentioned), a mechanical stage for navigation, a device cooling subsystem, a vibration isolation subsystem, a computer with display and user input devices, a safety interlock system, and so on. Thereby, the cost of each individual module is drastically reduced.

Computer 250 is pre-programmed with software that may also be modular in design. That is, common core software will control shared hardware components. Data processing, computer-aided design (CAD) navigation, data storage, etc. will also be common. Software particular to a specific hardware module will be loaded or unloaded as needed.

Figure 3:
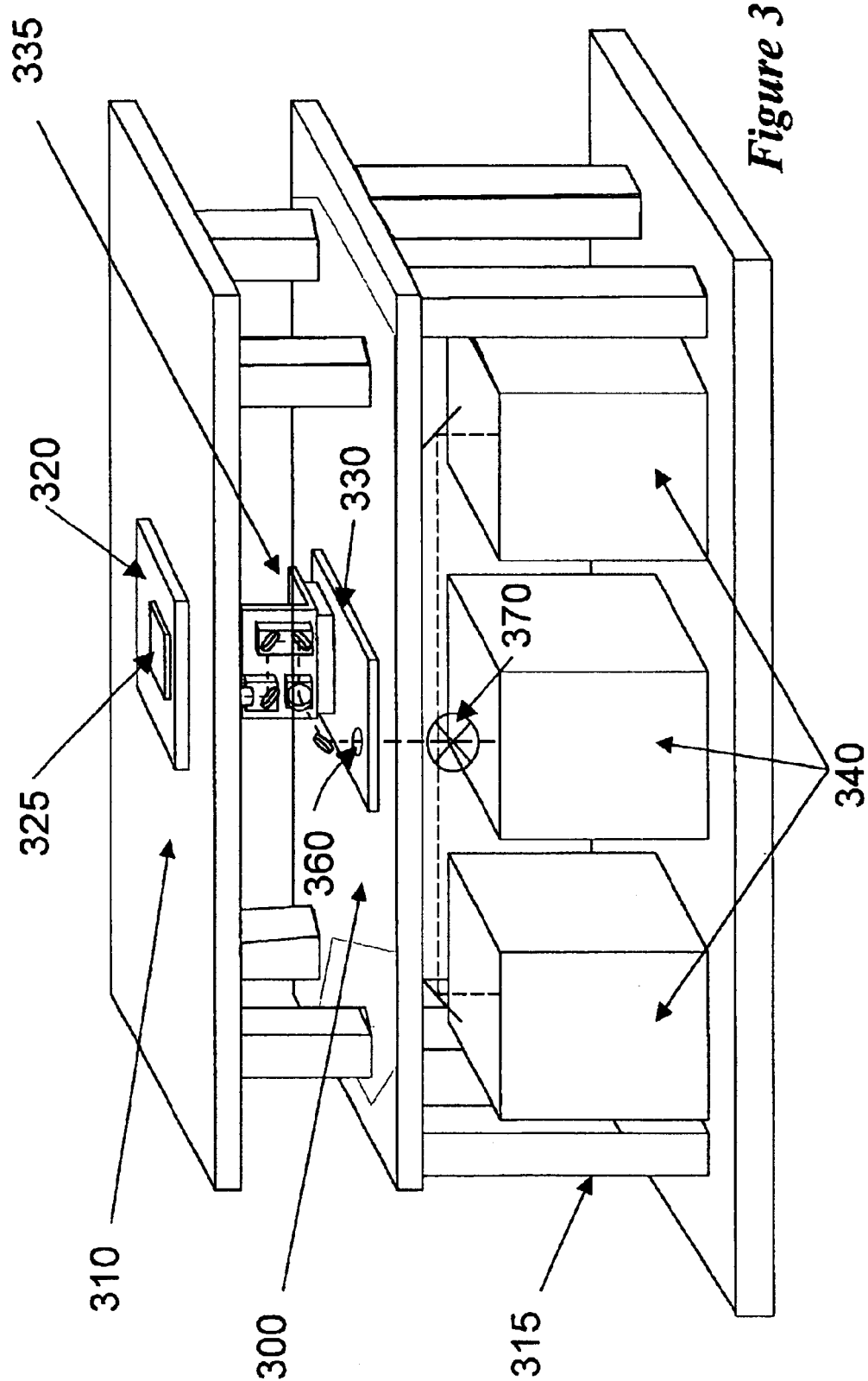
FIG. 3 is a perspective view showing an embodiment of the invention.

FIG. 3 is a perspective schematics of a universal platform according to an embodiment of the invention. The mechanical frame consists of a tabletop 300, held up by four support legs 315, which may include conventional vibration isolation mechanism therein (not shown). A fixture table 310 is mounted on top of the tabletop 300. A movable stage 330, such as an x-y-z stage, is situated on the tabletop 300. An optical mirror servo arrangement 335 is mounted onto the stage 330. An object to be inspected 325, such as an IC Device Under Test (DUT), is attached to a load plate 320, and this fixture arrangement is mounted onto the fixture table 310. The mechanical assembly is designed to be mechanically stable and thermally compensated.

The DUT 325 is mounted onto the load plate 320 and is stationary. In order to investigate various locations on the DUT, the movable stage 330 is manipulated so as to bring a collection lens to image the appropriate portions of the DUT. The mirror system 335 compensates for the motion of the lens and directs the beam through the same location in the aperture 360 on the tabletop 300.

The measurement modules 340 are stationary within the mechanical frame. They may be removable or fixed within the frame. If they are removable, they are located in the frame by some repeatable mechanical system, such as a ball, groove, and plate system well known to those skilled in mechanical design. There may be one or more modules. Three modules are shown in this embodiment as an example. A switchable mirror 370 is provided above the middle measurement module, and allows the light from the collection optics to be sent to the left or the right module 340, or if the mirror is remove the light can be passed to the middle module 340.

Figure 4:
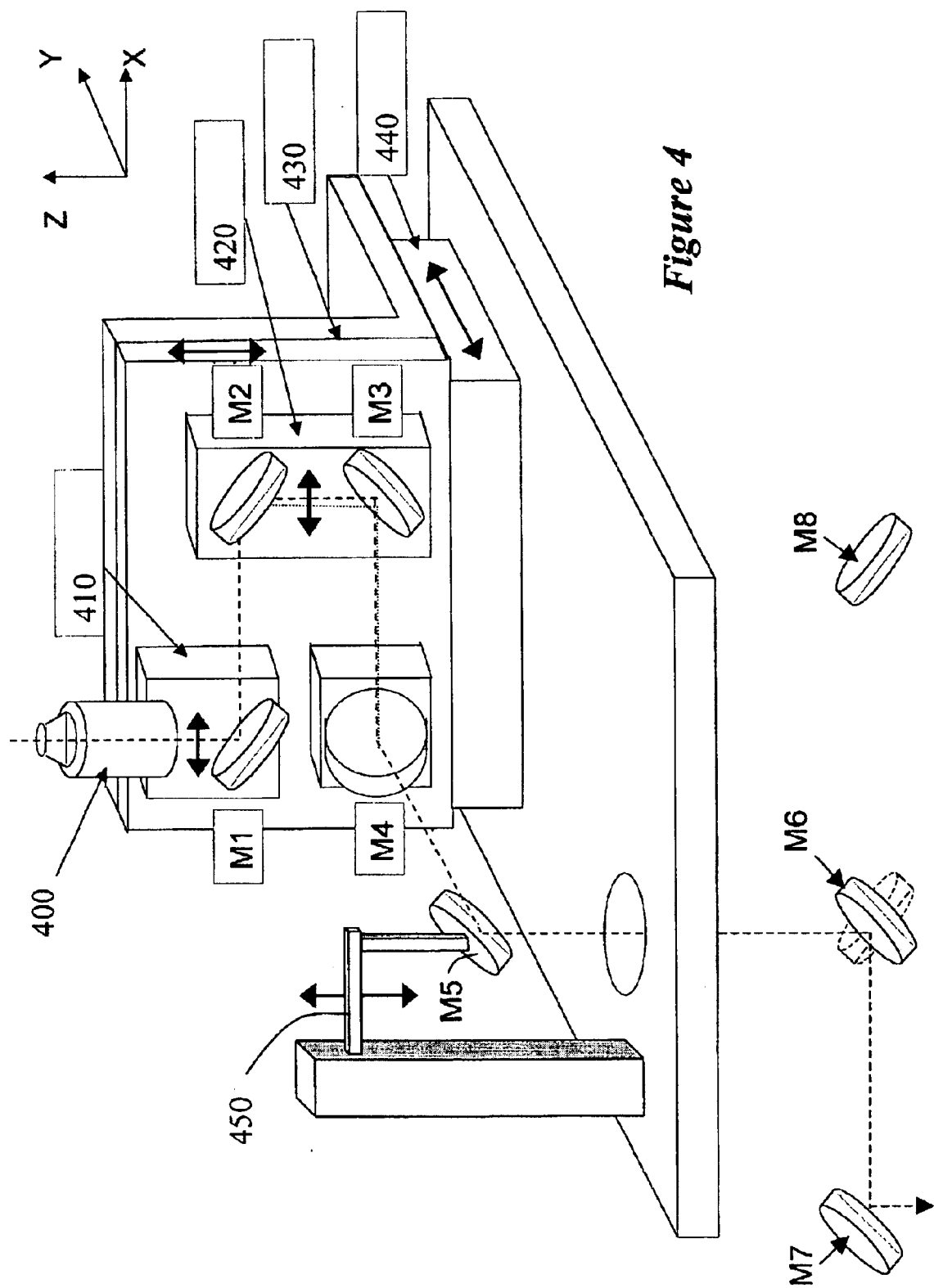
FIG. 4 is a perspective view of an optical collection arrangement according to an embodiment of the invention.

FIG. 4 depicts the mirror servo and lens system 335 in more detail according to a specific embodiment. Collection lens arrangement 400, such as an objective lens, is movable in X, Y, and Z directions; while the system compensates for the motion of the lens with a plurality of mirrors M1–M5. Ideally, the mirror servo system 335 will adjust so that the path length from the tip of the lens 400 to the mirror M5 is constant, and the position of the beam on mirror M5 is constant. However, if the beam is collimated after the collection lens 400, compensation to adjust path length is of secondary importance.

This particular embodiment describes a system that maintains both path length and beam position on the mirror M5. The DUT (not shown) is stationary above the collection lens 400. The lens may be moved in X by moving stage 410, in the Z direction by moving stage 430, and in the Y direction by moving stage 420. Collection lens 400 and mirror M1 are mounted onto stage 410. Mirrors M2 and M3 are mounted on stage 420. Mirror M4, stage 410, and stage 420 are mounted on stage 430. Mirror M5 may be stationary (for collimated light), or may be movable in the Z-direction by stage 450.

If collection lens 400 is moved distance dX in X by stage 410, mirrors M2 and M3 move dX/2 by stage 420 to compensate. If collection lens 400 is moved dY in Y direction by stage 440, then mirrors M2 and M3 are moved dY/2 in Y direction to compensate. If collection lens 400 is moved dZ by stage 430 then M5 is moved dZ to compensate.

By the above described means, the beam position and path length at M5 is unchanged as the lens position in X, Y, and Z is changed, thus allowing different portions of the DUT to be imaged and the optical system to be focused.

Figure 5:
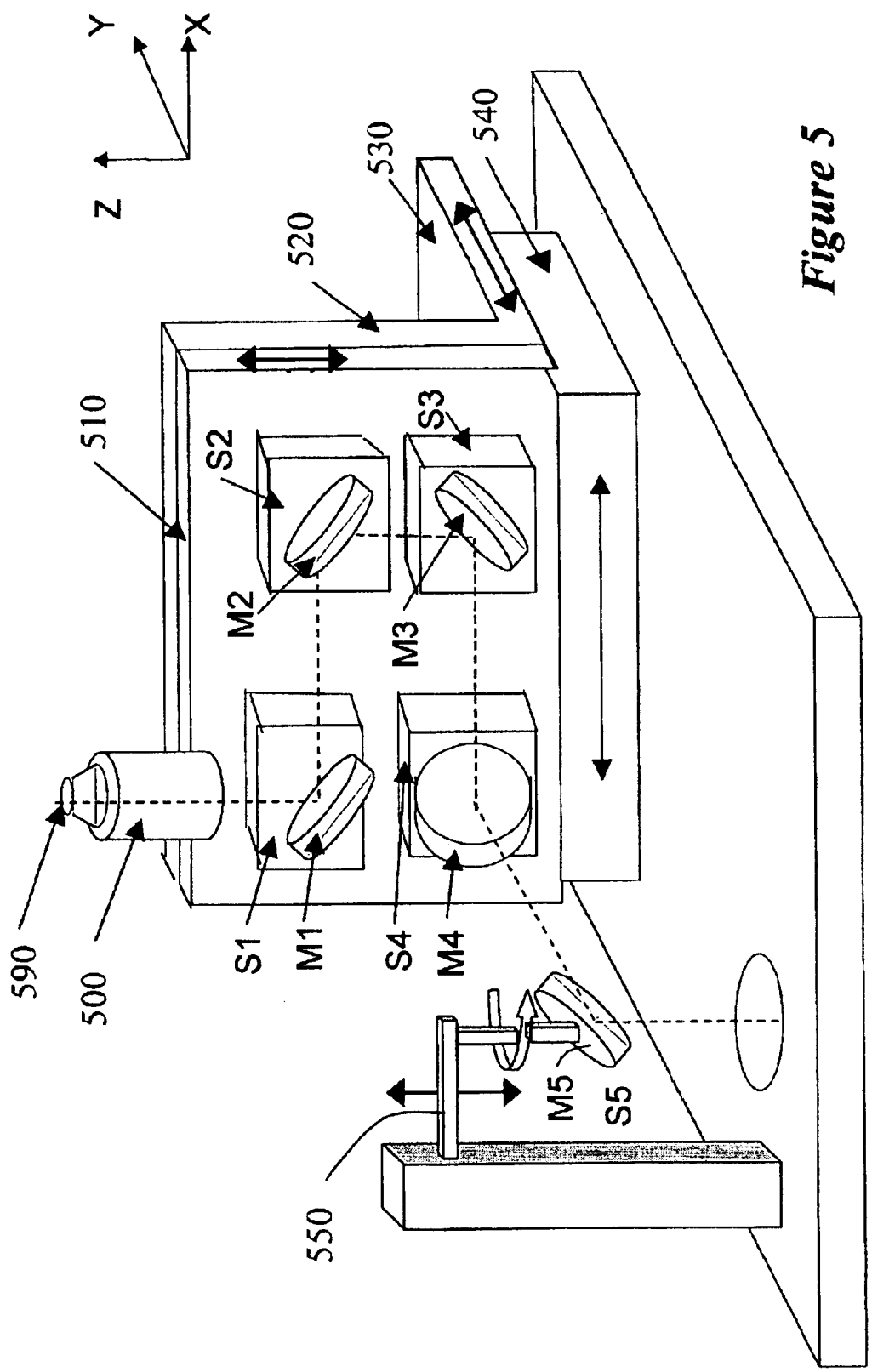
FIG. 5 depicts yet another embodiment of the mirror servo and lens system, which may be used in any of the embodiments of the inventive universal platform.

FIG. 5 depicts yet another embodiment of the mirror servo and lens system, which may be used in any of the embodiments described above. According to this particular embodiment, the collection optics 500, such as an objective lens, is rigidly mounted onto an x-y-z stage, wherein stage 540 provides x-motion, stage 530 provides y-motion, and stage 510 provides z-motion. Each of mirrors M1–M5 is provided with an independently controlled servo motions S1–S5. Each of servo motion S1–S5 provides independent transnational and/or rotational motion for a single one of mirrors M1–M5. Thus, when the controller provides motion signal to the stage in order to place the collection optics at a location of interest, the controller also provides motion signals to each of the servos S1–S5, so as to position each of the mirrors in a situation what would together compensate for the motion of the collection optics.

Another feature depicted in FIG. 5 is the provision of a solid immersion lens 590. That is, as is well known, photon emission testing is performed under very low photon emission count. Accordingly, means for efficiently collecting photons are highly desirable. Therefore, when one of the testing modules performs photon emission detection, a solid immersion lens 590 may be provided in the collection optics 500.

Figure 6:
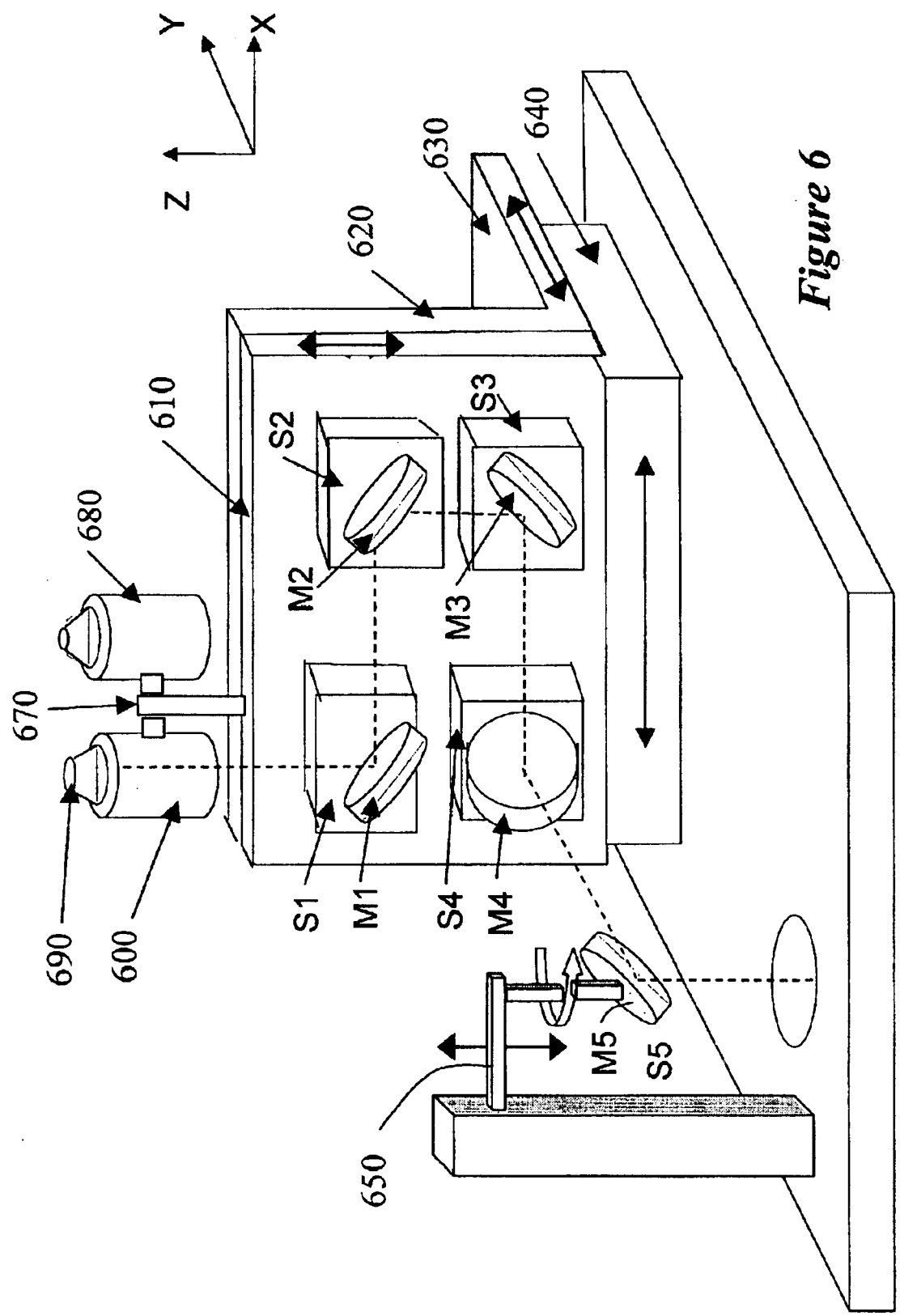
FIG. 6 depicts yet another embodiment of the mirror servo and lens system, which may be used in any of the embodiments of the inventive universal platform.

FIG. 6 provides yet another embodiment of the mirror servo and lens system, which may be used in any of the embodiments described above. This embodiment is similar to that depicted in FIG. 5, except that a plurality (in this example—two) of collection optics arrangement is provided. Notably, a provision 670, such as a turret or servo mechanism, can be manually or automatically controlled to select between collection optics 600 and 680. For example, the two or more collection optics may have different magnifications; or one arrangement may have an immersion lens 690 while the other not. Thus, depending on the test to be performed, the user may select the appropriate collection optics proper for the test.

An example of a general operation procedure is as follows. The user selects and installs modules that will be used during device diagnosis session. The device under test (DUT) is mounted in the DUT fixture. The appropriate cooling, electrical stimulus, etc. are provided and connected. The user applies power to the device using a power supply and stimulates the device using an electrical stimulus of some kind. This may be done using the computer of the inventive platform, or using a conventional tester equipment, e.g., an ATE. The user selects the appropriate optics for imaging. The user prepares the system by navigating to the location of interest using the integrated mechanical stage. The navigation system may include navigation with integrated imaging (LSM, SEM, flood illumination, etc.), CAD-assisted navigation with integrated netlist, etc. The goal of the navigation is to located regions of interest to be analyzed by the various modules. Various structures on the DUT may be used to assist in navigation.

With the DUT in the desired condition, i.e., the optics aimed at the appropriate location on the DUT, as the DUT is stationary, the user uses one or more of the modules to perform a measurement. Data is acquired, stored, and analyzed using a computer. The user repeats the process of selecting modules and performing measurements until the problem is solved.

The various modules may include static emission (for example, silicon CCD camera, MCT 2D array, or InGaAs 2D array); dynamic emission (for example, time-resolved imaging or non-imaging photon counting detector); thermal mapping (for example Si bolometric array); LSM incorporating LJVA, TIVA, or other laser-based circuit analysis technique. Modules may include non-invasive methods for measuring current-voltage curves (IV) curves inside a device, or absolute voltage levels within a device. Modules may also include focussed ion beam (FIB), atomic force microscope (AFM), scanning electron microscope (SEM), etc. Other modules may be incorporated as they are identified and developed.

While the invention has been described with reference to particular embodiments thereof, these embodiments are not intended as limiting the invention, but rather as an aid for understanding the full scope of the invention, as defined by the appended claims. While various modifications and changes may be readily recognized by those of ordinary skill in the art, any such modifications and changes that are encompass by the spirit and scope of the invention should be considered as part of the invention.

What is claimed is:

1. A universal platform for performing analysis, measurements and diagnostics on an integrated circuit (IC), comprising:
   mounting fixture supporting said IC;
   an imaging system;
   a navigation system for locating the region of the IC to be investigated;
   a plurality of testing modules, each for performing different investigation on the IC;
   a controller operable for switching among the modules to perform investigations on the IC and for selecting software data acquisition methods appropriate for the selected module.

2. The platform of claim 1, wherein said imaging system comprises collection optics having an optical path to at least one of the modules.

3. The platform of claim 1, wherein at least one of said modules is a tester selected from the group: static emission tester, dynamic emission tester, thermal mapping tester, and laser based tester.

4. The platform of claim 1, wherein said mounting fixture incorporate means for cooling the IC.

5. The platform of claim 1, wherein said mounting fixture incorporates means for electrically stimulating the IC.

6. The platform of claim 1, wherein said IC is a packaged integrated circuit chip.

7. The platform of claim 1, wherein said IC is a semiconductor wafer.

8. A universal testing platform for a plurality of testing modules designed to analyze a specimen, comprising:
   a main tabletop, having a plurality of bays for accepting the plurality of testing modules;
   a specimen mount provided over said main tabletop;
   a movable stage mounted onto said main tabletop;
   a collection optics mounted onto said movable stage;
   a plurality of motion controllable mirrors;
   a controller providing motion signals to said movable stage and said controllable mirrors.

9. The Universal testing platform of claim 8, further comprising a plurality of vibration isolators.

10. The universal testing platform of claim 8, further comprising specimen cooling subsystem.

11. The universal testing platform of claim 8, wherein said collection optics further comprises a solid immersion lens.

12. The universal testing platform of claim 8, wherein said collection optics further comprises a plurality of objective lenses.

13. The universal testing platform of claim 8, further comprising at least one of laser illumination and flood illumination.

14. The universal testing platform of claim 8 further comprising one of a emission tester, dynamic emission tester, thermal mapping tester, and laser based tester.

15. A universal platform for performing analysis on an integrated circuit (IC), comprising:
   a fixture table;
   an IC mount attached to said fixture table;
   collection optics situated to collect light from said IC;
   a plurality of testing modules;
   optical arrangement operable to selectively establish an optical path from said collection optics to any of said testing modules.

16. The universal platform of claim 15, wherein said optical arrangement comprises an optical mirrors servo arrangement.

17. The universal platform of claim 16, wherein optical mirrors servo arrangement defines a path length, and wherein when said optical mirrors servo arrangement is operated to selectively establish an optical path from said collection optics to any of said testing modules, said path length remain constant.

18. The universal platform of claim 15, wherein said collection optics comprises a plurality of objective lenses.

19. The universal platform of claim 18, wherein said collection optics further comprises an immersion lens.

20. The universal platform of claim 15, further comprising a navigation system.

* * * * *